(12) United States Patent
    Pelletier

(10) Patent No.: US 10,444,445 B2
(45) Date of Patent: Oct. 15, 2019

(54) OPTICALLY ISOLATED PHOTODIODE FOR HIGH SENSITIVITY APPLICATION

(71) Applicant: Ciena Corporation, Hanover, MD (US)

(72) Inventor: Francois Pelletier, Quebec (CA)

(73) Assignee: Ciena Corporation, Hanover, MD (US)

( * ) Notice: Subject to any disclaimer, the term of this patent is extended or adjusted under 35 U.S.C. 154(b) by 135 days.

(21) Appl. No.: 15/430,126

(22) Filed: Feb. 10, 2017

(65) Prior Publication Data

US 2018/0233606 A1    Aug. 16, 2018

(51) Int. Cl.
    *G02B 6/42*      (2006.01)
    *H01L 27/142*    (2014.01)
    *G02B 6/12*      (2006.01)

(52) U.S. Cl.
    CPC .............. *G02B 6/42* (2013.01); *H01L 27/142* (2013.01); *G02B 2006/12061* (2013.01)

(58) Field of Classification Search
    CPC ......... H01L 31/02327; H01L 31/02005; H01L 27/142; G02B 6/13; G02B 6/42; G02B 2006/12061
    See application file for complete search history.

(56) References Cited

U.S. PATENT DOCUMENTS

| | | | | |
|---|---|---|---|---|
| 5,780,875 A * | 7/1998 | Tsuji | ................... | G02B 6/4224 257/81 |
| 5,909,523 A * | 6/1999 | Sakaino | ................... | G02B 6/42 156/293 |
| 6,195,485 B1 * | 2/2001 | Coldren | ................ | G02B 6/4202 385/49 |
| 6,882,763 B2 * | 4/2005 | Kuhara | .................. | G02B 6/421 385/14 |
| 7,224,875 B2 * | 5/2007 | Murata | ................ | G02B 6/4214 372/29.011 |
| 7,418,166 B1 * | 8/2008 | Kapur | ................ | G02B 6/12007 216/2 |
| 2002/0001427 A1 * | 1/2002 | Hashimoto | .......... | G02B 6/4246 385/14 |
| 2003/0044119 A1 * | 3/2003 | Sasaki | .................. | G02B 6/4214 385/49 |

(Continued)

*Primary Examiner* — Thanh Luu
*Assistant Examiner* — Jennifer D Bennett
(74) *Attorney, Agent, or Firm* — Clements Bernard Walker PLLC; Christopher L. Bernard; Lawrence A. Baratta, Jr.

(57) ABSTRACT

An integrated silicon-based photo-detection system, fabricated in an integrated silicon based structure on a silicon-on-insulator (SOI) wafer, includes a photodiode fabricated on an isolated area surrounded by a light barrier, where the light barrier is an area where the SOI wafer is removed, an optical waveguide that guides an input signal light into the photodiode, and external electrical traces that the free electron carriers flow into as photocurrent. A method of fabricating an integrated silicon-based photo-detection system in an integrated silicon based structure on a silicon-on-insulator (SOI) wafer, includes performing deep etching to create a light barrier surrounding an isolated area on the SOI wafer, fabricating a photodiode in the isolated area surrounded by the light barrier, fabricating an optical waveguide that guides an input signal light into the photodiode, and wirebonding external electrical traces to connect to the remainder of the integrated silicon based structure.

20 Claims, 6 Drawing Sheets

(56) References Cited

U.S. PATENT DOCUMENTS

| | | | | |
|---|---|---|---|---|
| 2003/0086653 A1* | 5/2003 | Kuhara | ................ | G02B 6/4214 385/49 |
| 2004/0129935 A1* | 7/2004 | Blauvelt | .............. | G02B 6/4204 257/40 |
| 2012/0025265 A1* | 2/2012 | Ji | ...................... | H01L 31/02327 257/184 |
| 2014/0124669 A1* | 5/2014 | Zheng | ................ | G02B 6/12004 250/340 |
| 2016/0170158 A1* | 6/2016 | Zheng | ................. | G02B 6/4224 438/27 |

* cited by examiner

OPTICALLY ISOLATED PHOTODIODE FOR HIGH SENSITIVITY APPLICATION

FIELD OF INVENTION

The present invention relates generally to an integrated silicon-based photo-detection system, fabricated in an integrated silicon based structure on a silicon-on-insulator (SOI) wafer.

BACKGROUND OF INVENTION

Silicon photonics is using silicon integrated circuits technology so that data can be sent and received through light guided in a waveguide. Such devices, fabricated on a silicon-on-insulator (SOI) wafer and operating at the 1.3 µm and 1.55 µm telecom wavelength, offer the potential for on-chip monolithic integration of telecommunication systems. In particular, developing photodetectors for the telecom wavelength using standard Silicon-on-Insulator Complementary Metal-Oxide-Semiconductor (SOI CMOS) manufacturing processes plays an essential role towards the potential.

Among requirements for the photodetectors to be integrated in the telecommunication system, silicon photodetectors are required to operate at frequency range beyond 20 GHz, which has already been demonstrated up to 50 GHz. Another target requirement for the photodetectors is low-voltage operation, i.e., bias voltage <5V and as low as 1V for advanced CMOS generation. This has also been demonstrated, as Ge doped photodetectors can operate with bias voltage in 1-15V at telecom wavelength. A further requirement is a sensitivity of the photodetectors that allows detection of a low current on the order of 1 µA. Therefore, the dark current (i.e. noise, a small current produced when no light is present) must be minimized with respect to photocurrent signals (i.e., current generated when light is absorbed in the photodiode) to maximize the signal-to-noise ratio.

SUMMARY

In general, in one aspect, one or more embodiments of the invention relate to an integrated silicon-based photo-detection system, fabricated in an integrated silicon based structure on a silicon-on-insulator (SOI) wafer. An integrated silicon-based photo-detection system includes a photodiode fabricated on an isolated area surrounded by a light barrier, where the light barrier is an area where the SOI wafer is removed, an optical waveguide that guides an input signal light into the photodiode, and external electrical traces that the free electron carriers flow into as photocurrent.

In general, in one aspect, one or more embodiments of the invention relate to a method of fabricating an integrated silicon-based photo-detection system in an integrated silicon based structure on a silicon-on-insulator (SOI) wafer. The method includes performing deep etching to create a light barrier surrounding an isolated area on the SOI wafer, fabricating a photodiode in the isolated area surrounded by the light barrier, fabricating an optical waveguide that guides an input signal light into the photodiode, and wirebonding external electrical traces to connect to the remainder of the integrated silicon based structure.

Other aspects of the invention will be apparent from the following description and the appended claims.

DETAILED DESCRIPTION

Figure 1:
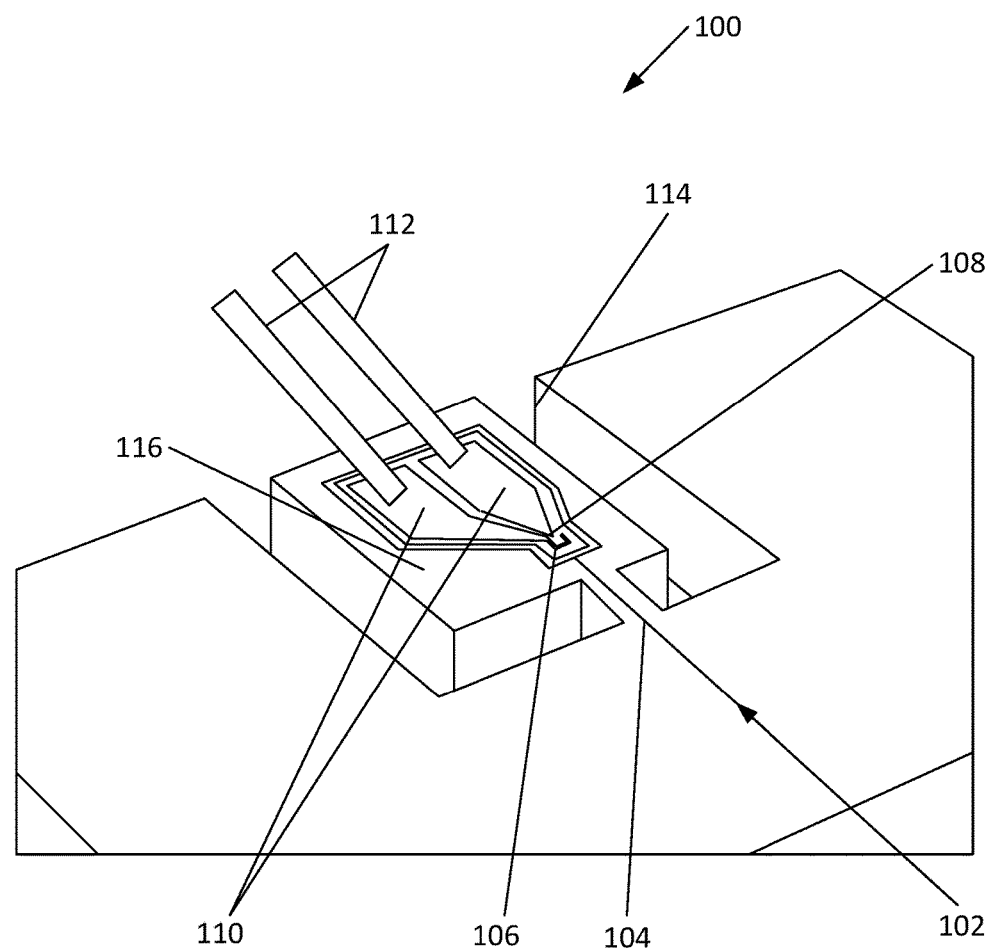
FIG. 1 illustrates a schematic view of an integrated silicon-based photo-detection system 100 fabricated a silicon-on-insulator (SOI) wafer according to one or more embodiments of the invention.

Specific embodiments of the invention will now be described in detail with reference to the accompanying figures. Like elements in the various figures are denoted by like reference numerals for consistency.

In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

Throughout the application, ordinal numbers (e.g., first, second, third, etc.) may be used as an adjective for an element (i.e., any noun in the application). The use of ordinal numbers is not to imply or create any particular ordering of the elements nor to limit any element to being only a single element unless expressly disclosed, such as by the use of the terms "before", "after", "single", and other such terminology. Rather, the use of ordinal numbers is to distinguish between the elements. By way of an example, a first element is distinct from a second element, and the first element may encompass more than one element and succeed (or precede) the second element in an ordering of elements.

FIG. 1 illustrates a schematic view of an integrated silicon-based photo-detection system 100 fabricated on a silicon-on-insulator (SOI) wafer according to one or more embodiments of the invention. An input signal light 102 is guided in an optical waveguide 104, which is optically coupled to a silicon photodiode 106. The silicon photodiode 106 may comprise germanium (Ge). Both the optical waveguide 104 and the photodiode 106 may be formed in the integrated silicon based structure on the silicon-on-insulator (SOI) wafer (used interchangeably herein with "chip"). Upon optical coupling of the signal light 102 into the photodiode 106, the optical energy of the coupled light 108 is absorbed in the photodiode 106, creating free electron carriers. These free electron carriers may be detected as photocurrent flowing into external electrical traces 110. The external electrical traces 110 are connected to the remainder of the chip via wirebonds 112. The external electrical traces 110 and the wirebonds 112 may comprise aluminum, copper, silver, gold, another suitable metal, or any combination thereof.

In one or more embodiments of the invention, the optical coupling between the silicon waveguide 104 and the germanium photodiode 106 may involve a modal transformation, because germanium and silicon have fairly similar refractive indexes and germanium, which has a slightly higher refractive index than silicon, tends to absorb light from silicon. Therefore, the signal light 102 confined in the silicon waveguide 104 is absorbed into the germanium photodiode 106.

The photodiode 106 may absorb the coupled light 108 and create photocurrent (i.e. signal) even when no external voltage is applied across a pair of electrical traces 110 adjacent to the photodiode 106 (in a photovoltaic mode). In the photovoltaic mode, the amount of dark current (i.e. noise) is kept at a minimum, and therefore the signal-to-noise ratio may be maximized.

In one or more embodiments of the invention, the photon absorption process in the photodiode 106 may include two-photon absorption (TPA). An absorption of an infrared photon at the telecom wavelength (1.55 μm or 0.8 eV) is insufficient to excite a valence electron into the conduction band as a free electron carrier in silicon, which has an indirect electronic bandgap of 1.1 eV. In TPA, two infrared photons are absorbed simultaneously by silicon, the sum of the energy of the two infrared photons is sufficient to overcome the bandgap 1.1 eV of silicon, allowing a valence electron to be released as a free electron carrier. Because TPA relies on nonlinear interactions between the optical field and silicon, TPA is proportional to higher orders of optical intensity.

In one or more embodiments of the invention, the photon absorption process in the photodiode 106 may include Mid-Bandgap Absorption (MBA). Extrinsic impurities (i.e. foreign atoms) or intrinsic crystalline defects may be intentionally introduced as dopants or recombination centers introduce discrete energy levels within the band gap 1.1 eV of pure silicon. An absorption of an infrared photon may be permitted to such discrete energy levels.

Alternatively, the photon absorption process in the photodiode 106 may include surface-state absorption (SSA), or internal photoemission absorption (IPA).

Further, the photodiode 106 may be isolated from the rest of the chip by a light barrier 114. The light barrier 114 may be fabricated by removing an area surrounding the photodiode 106 to create an isolated area 116 (i.e. the area enclosed within the light barrier 114), by a SOI CMOS manufacturing process, called "deep etch." The deep etch process is commonly used to cut a SOI wafer with a clean surface for die separation, with a fabrication accuracy on the order of micrometers. However, in one or more embodiments of the invention, the deep etch process is used to optically isolate the photodiode from the chip scattered light that creates a floor noise level, creating a light barrier 114 around the photodiode 116. As a result, the light barrier 114 is very precisely etched (to the μm level) and may be placed close enough to photodiode 106 to cut off most of the incoming light from the chip substrate. In one or more embodiments, the light barrier width is sufficient to achieve an aspect ratio that meets the wafer fab design rules. Typically, a ratio of depth to width of 4:1 is sufficient to insure a repeatable process. For example, a 100 um deep light barrier cavity, should have a minimum width of 25 um. The width may need to be increased to suit the viscosity of an adhesive that can be poured to further enhance the light barrier.

Those skilled in the art will appreciate that while some of the input signal light 102 into the photodiode 106 is scattered at an interface with the waveguide 104, the scattered light may not be trapped in the light barrier 114, because of the low refractive index (1.0) of the air in the light barrier 114, as compared to the refractive index (about 3.5) of a silicon chip. As a result, the noise due to the scattered light may be significantly reduced.

Although FIG. 1 illustrates a particular arrangement of the waveguide 104, the photodiode 106, external electrical traces 110, the light barrier 114, and the isolated area 116, the scope of the invention should not be considered limited to this specific arrangement. For example, the integrated silicon-based photo-detection system 100 may include multiple waveguides which are coupled to the photodiode 106 and/or multiple photodiodes.

However, one or more embodiments of the invention shown in FIG. 1 illustrates an example of an on-chip monolithic integration of optical communication system that may be integrated in a telecommunication network, in which a silicon on-chip photodiode may convert ultrafast light pulses at Gbit/s at ultralow energy at 1 pJ into an electrical signal and feed into the electrical traces, all on the chip.

Figure 2:
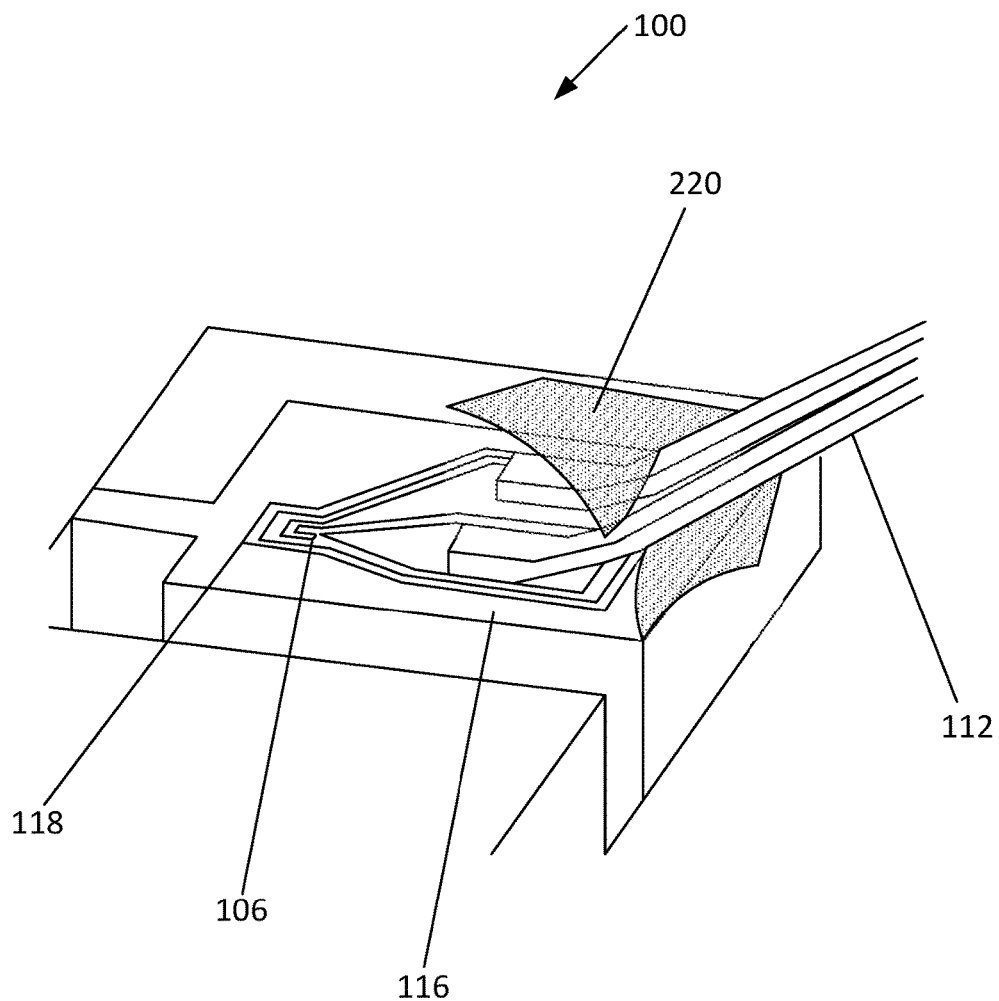
FIG. 2 illustrates a schematic view of an additional feature to the integrated silicon-based photo-detection system 100 according to one or more embodiments of the invention.

FIG. 2 illustrates a schematic view of an additional feature to the integrated silicon-based photo-detection system 100 according to one or more embodiments of the invention. In FIG. 2, the isolated area 116 surrounded by the light barrier 114 in the photo-detection system 100 is potted with a light blocking or absorbing adhesive 220, to further reduce the noise due to light entering from the SOI wafer into the isolated area 116 and light entering from above the photodiode 106.

Materials for the potting may comprise commercially available optically opaque epoxy, for example, EPO-TEK® 320 and Polytec F156, which both block light at near infrared and visible wavelengths at which the photodiode 106 is sensitive. Specifically, as shown in FIG. 2, the photodiode 106 and the wirebonds 112 are covered by a light blocking adhesive 220. Light entering from the SOI wafer into the isolated area 116 may be blocked by the light blocking adhesive 220 from recirculating and being trapped in the isolated area 116. Light entering from above the photodiode 106 may be blocked by the light blocking adhesive 220 from reaching the photodiode 106.

Figure 3:
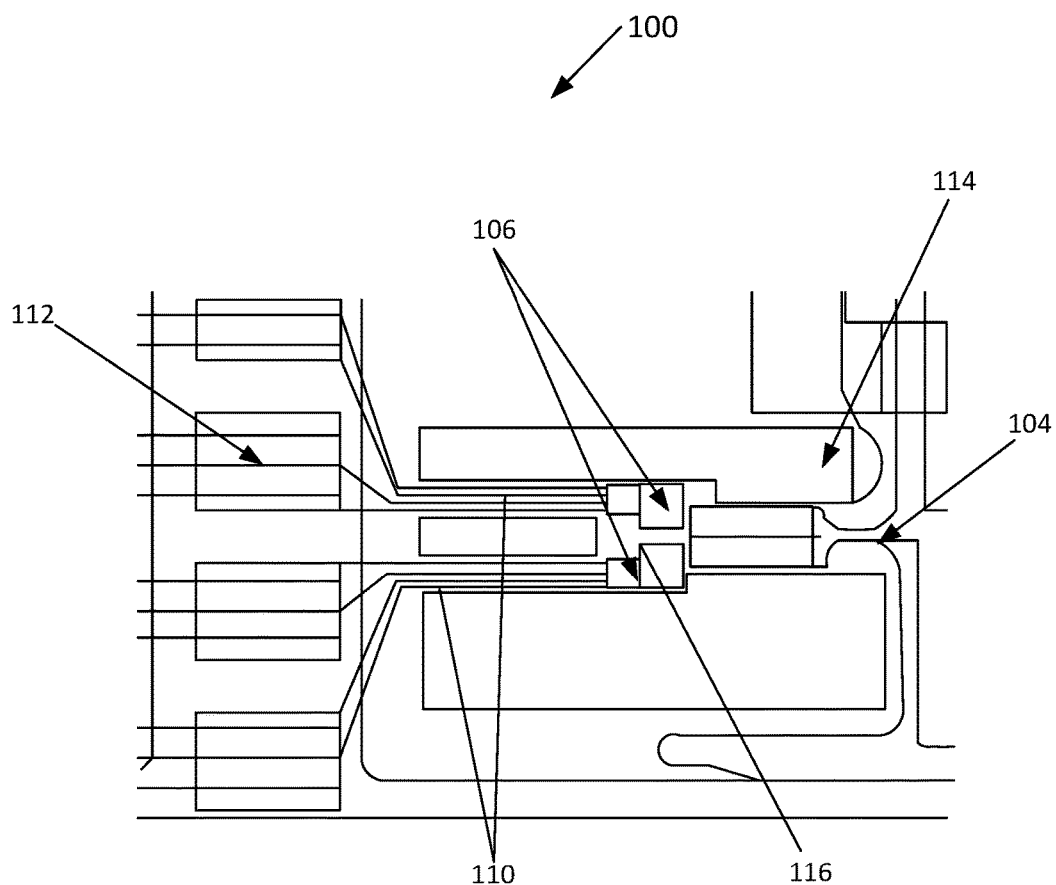
FIG. 3 illustrates a schematic view of additional features to the integrated silicon-based photo-detection system 100 according to one or more embodiments of the invention.

FIG. 3 illustrates a schematic view of additional features to the integrated silicon-based photo-detection system 100 according to one or more embodiments of the invention. In FIG. 3, the wirebonds 112 may be located relatively farther away from the photodiode 106, outside of the isolated area 116, while the electrical traces 110 may be partially in the isolated area 116, to further isolate the photodetector 106 from the light scattered into the chip. The end of the electrical traces 110 connected to the photodiode 106 are in the isolated area 116 and the other end connected to the wirebonds 112 are outside of the isolated area 116.

FIG. 3 also shows that more than one photodiode (e.g., two photodiodes as shown in FIG. 3) 106 may be grouped in the isolated area 116 surrounded by the light barriers 114. Although FIG. 3 illustrates a particular arrangement of two photodiodes 106 in the isolated area 116, the scope of the invention should not be considered limited to this specific arrangement. For example, the integrated silicon-based photo-detection system 100 may include multiple photodiodes in the isolated area 116.

Figure 4A:
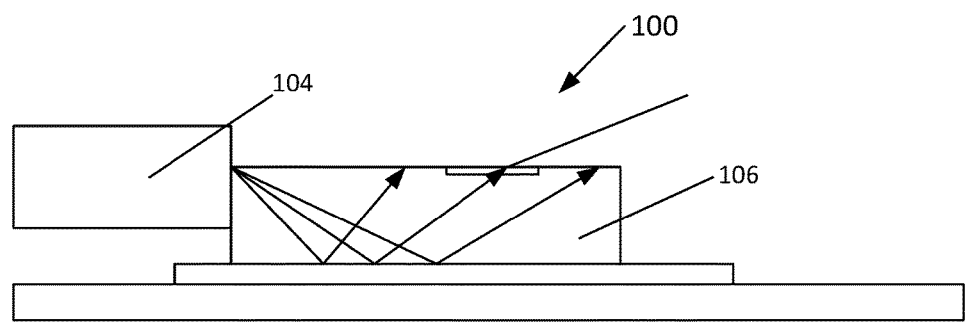
FIGS. 4A and 4B illustrate enlarged views of the waveguide 104 and the photodiode 106 on the SOI wafer of the integrated silicon-based photo-detection system 100 according to one or more embodiments of the invention.
Figure 4B:
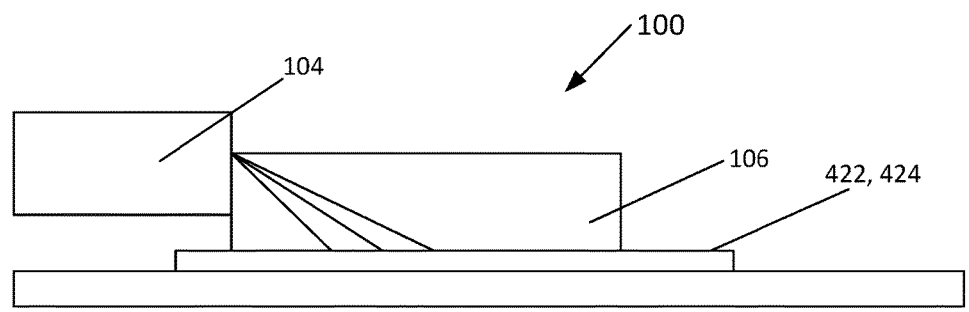

FIGS. 4A and 4B illustrate enlarged views of the waveguide 104 and the photodiode 106 on the SOI wafer of the integrated silicon-based photo-detection system 100 according to one or more embodiments of the invention. In FIG. 4A, light entering the photodiode 106 from the waveguide 104 may be reflected at the bottom of the photodiode 106 and trapped inside the photodiode, which also acts as a noise to the photodiode 106. In FIG. 4B, as an additional feature to the integrated silicon-based photo-detection system 100 according to one or more embodiments of the invention, an anti-reflective coating 422 is added at the bottom of the photodiode 106 to eliminate the light reflecting at the bottom of the photodiode 106. The anti-reflective coating 422 may comprise thin film structures with layers of alternating refractive indexes. The thickness of the thin films may be chosen to produce destructive interference with the light reflected at the bottom of the photodiode 106 and constructive interference with the signal light 102 at a wavelength of interest.

In FIG. 4B, as another additional feature to the integrated silicon-based photo-detection system 100 according to one or more embodiments of the invention, a light absorbing adhesive 424 may further be added at the bottom of the photodiode 106 to reduce the light reflected at the bottom of the photodiode 106. The reflectivity of a surface between two materials with refractive index $n_1$ and $n_2$, respectively, is given by $$\left[\frac{n_1 - n_2}{n_1 + n_2}\right]^2$$

(Fresnel equations). Therefore, the reflection at the bottom of the photodiode 106 may be reduced with the anti-reflective coating 422 matched to the adhesive 424 that has a refractive index similar to that of the anti-reflective coating (i.e., $n_1$ is nearly equal to $n_2$). The noise due may be further reduced by the anti-reflective coating 422 and the light absorbing adhesive 424 at the bottom of the photodiode 106.

Figure 5:
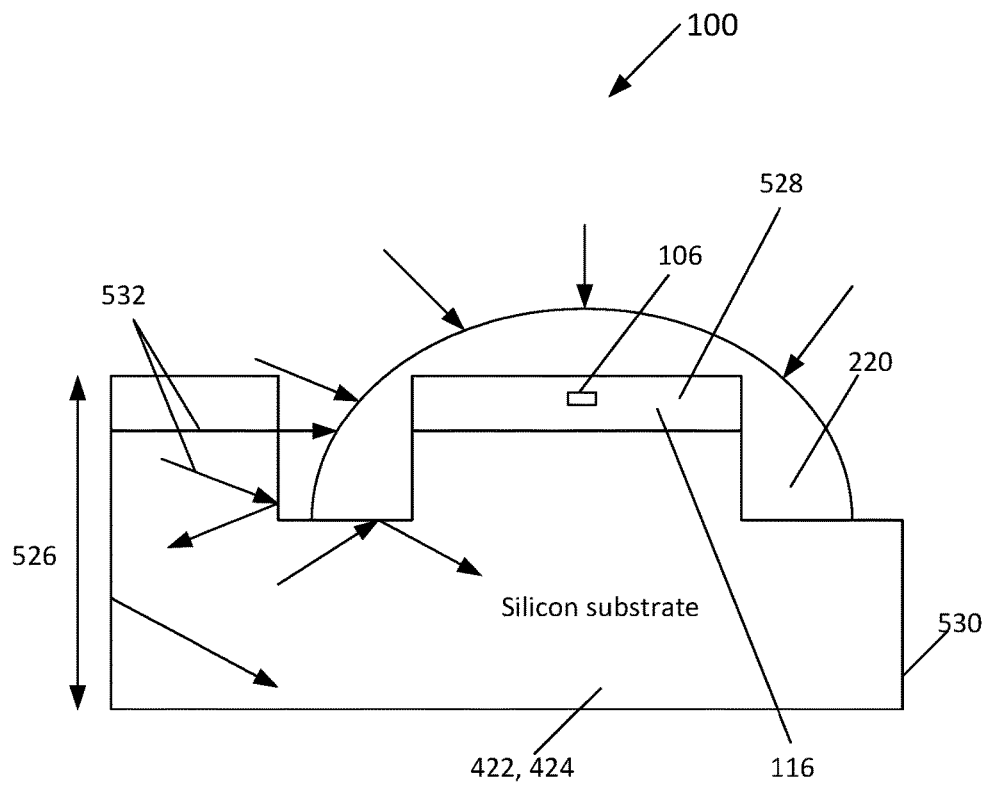
FIG. 5 illustrates an overall schematic side view of the integrated silicon-based photo-detection system 100, including the features illustrated in FIGS. 2, 3, and 4B, according to one or more embodiments of the invention.

FIG. 5 illustrates an overall schematic side view of the integrated silicon-based photo-detection system 100, including the features illustrated in FIGS. 2, 3, and 4B, according to one or more embodiments of the invention.

A SOI wafer 526 on which the integrated silicon-based photo-detection system 100 includes a dielectric layer 528, typically silicon dioxide, and a silicon substrate 530. The photodiode 106 may be embedded in the dielectric layer 528 in the isolated area 116, surrounded by the light barrier 114. The light barrier 114 may be fabricated by removing an area surrounding the photodiode 106, by the deep etch process. Due to the low refractive index (1.0) of the air in the light barrier 114, any scattered light may not be trapped in the light barrier 114. Further, the light barrier 114 may block the light 532 scattered inside the chip from entering the isolated area 116. Therefore, the noise due to the trapped light near the photodiode 106 and the scattered light in the chip may be reduced.

In addition, the isolated area 116 may be spotted by the light blocking adhesive 220. Light entering from above the photodiode 106 may be blocked by the light blocking adhesive 220 from reaching the photodiode 106. At the bottom of the silicon wafer 530 below the isolated area 116, the anti-reflective coating 422 and the index-matched adhesive 424 may be added to eliminate the light reflected underneath the photodiode 106. Therefore, the noise due to light entering from below and above the photodiode 106 may be reduced.

Embodiments of the invention provide a novel design for global light isolation for optical photodetectors from both ambient and scattered light to achieve very high sensitivity photodetectors. By providing a different use for an existing process "deep etch," a narrow isolation system in combination with an absorbing material (adhesive) to block light from a light-sensitive photodetector is achieved.

Further, the use of AR coating in combination with index matched light absorbing adhesive to block the remaining internal reflections by the bottom surface allows embodiments of the invention to remove potential remaining reflections. Embodiments of the invention may allow for Intradyne Coherent Receiver (ICR) monitoring photodiodes integrated on chip which meet the low light level required by the product specifications, allowing for the potential for much lower light level measurement in future high performance specifications.

Figure 6:
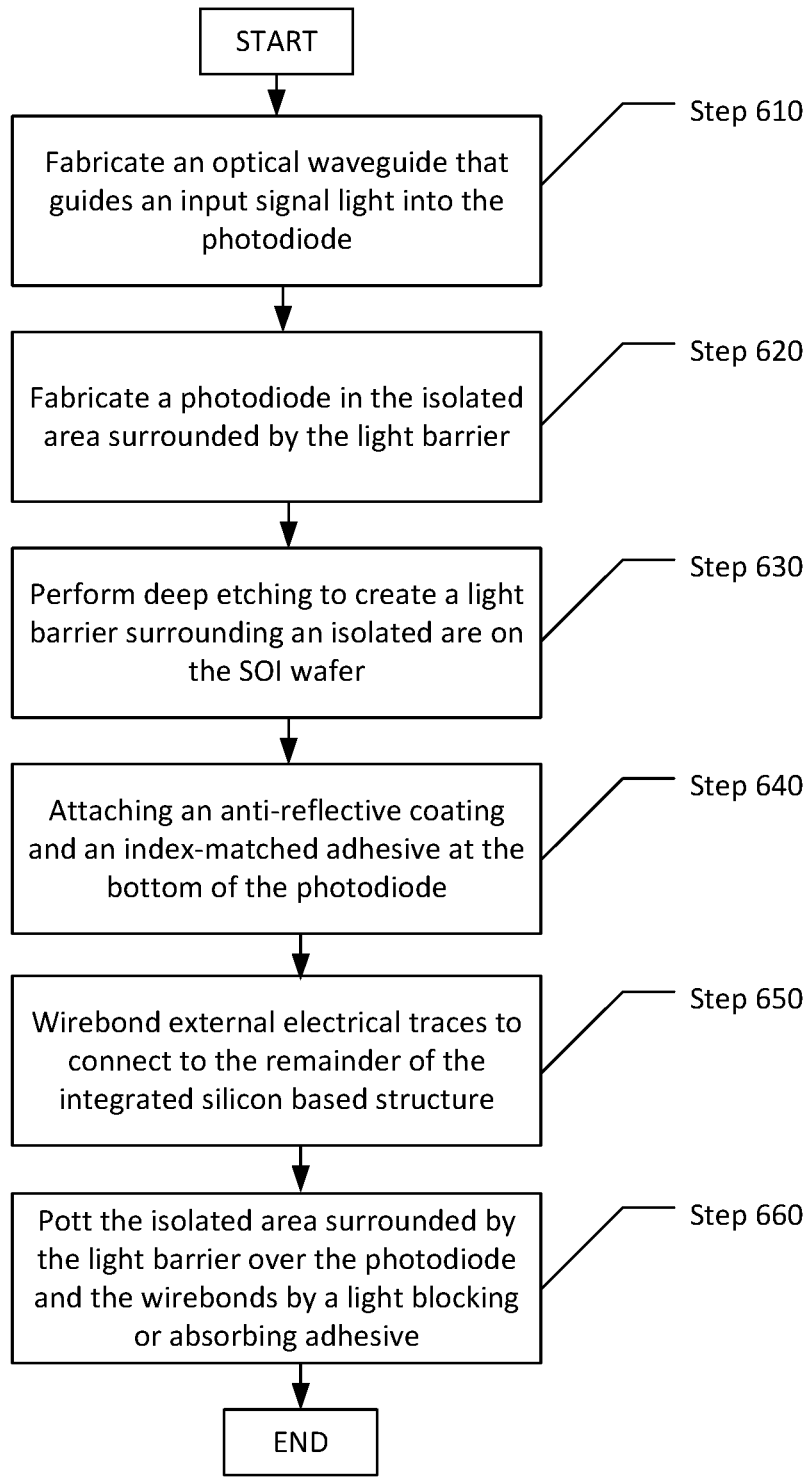
FIG. 6 illustrates a flowchart in accordance with one or more embodiments.

FIG. 6 illustrates a flowchart in accordance with one or more embodiments. Specifically, one or more steps in FIG. 6 may be performed to fabricate of an integrated silicon-based photo-detection system 100 fabricated a silicon-on-insulator (SOI) wafer as described in FIG. 1. While the various steps in these flowcharts are presented and described sequentially, one of ordinary skill in the art will appreciate that some or all of the steps may be executed in different orders, may be combined or omitted, and some or all of the steps may be executed in parallel. Furthermore, the steps may be performed actively or passively.

In Step 610, an optical waveguide is fabricated on the SOI wafer. An input signal light may be guided in the optical waveguide into the photodiode.

In Step 620, a photodiode is fabricated in the isolated area surrounded by the light barrier. In one or more embodiments, other photodiodes may be fabricated in the isolated area surrounded by the light barrier.

In Step 630, deep etching is performed to create a light barrier surrounding an isolated area on the SOI wafer by removing an area surrounding the photodiode. In one or more embodiments of the invention, the deep etch process is used to optically isolate the area from the rest of the SOI wafer.

In step 640, an anti-reflective coating and an index-matched adhesive are attached at the bottom of the photodiode, to eliminate the light reflecting at the bottom of the photodiode.

In Step 650, external electrical traces are fabricated and are connected the remainder of the integrated silicon based structure by wirebonding. In one or more embodiments, an end of the electrical traces connected to the photodiode may be in the isolated area; and the other end of the electrical traces connected to the wirebonds and the wirebonds may be outside of the isolated area, to further isolate the photodetector from the light scattered into the rest of the SOI wafer.

In Step 660, the isolated area surrounded by the light barrier over the photodiode and the wirebonds are potted by a light blocking or absorbing adhesive. The adhesive may block light at near field and visible wavelengths.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. An integrated silicon-based photo-detection system, fabricated in an integrated silicon based structure on a silicon-on-insulator (SOI) wafer, comprising:
   an isolated area of the SOI wafer formed by etching the SOI wafer to create a light barrier at least partially surrounding the isolated area of the SOI wafer on at least three sides of the isolated area of the SOI wafer, wherein the light barrier, when etched, is at least partially filled with air and is configured to at least partially isolate the isolated area of the SOI wafer from remaining areas of the SOI wafer;

a photodiode fabricated on the isolated area of the SOI wafer;

an optical waveguide that guides an input signal light into the photodiode, wherein the optical waveguide spans across the light barrier from the remaining areas of the SOI wafer to the isolated area of the SOI wafer, wherein the input signal light is absorbed in the photodiode and free electron carriers are created; and electrical traces fabricated on the isolated area of the SOI wafer, wherein the free electron carriers flow as photocurrent through the electrical traces.

2. The integrated silicon-based photo-detection system of claim 1, further comprising:

wirebonds that connect the electrical traces to remaining portions of the integrated silicon based structure.

3. The integrated silicon-based photo-detection system of claim 1, wherein the photodiode comprises germanium, and the photodiode operates in a photovoltaic mode.

4. The integrated silicon-based photo-detection system of claim 1, wherein the optical waveguide comprises silicon.

5. The integrated silicon-based photo-detection system of claim 1, wherein the input signal light in the optical waveguide is coupled to the photodiode via modal transformation.

6. The integrated silicon-based photo-detection system of claim 1, wherein the input signal light has a telecom wavelength of 1.55 µm.

7. The integrated silicon-based photo-detection system of claim 1, wherein the light barrier is formed micrometers from the photodiode, thereby cutting off a majority of the incoming light from the SOI wafer.

8. The integrated silicon-based photo-detection system of claim 1, wherein the electrical traces comprise a metal selected from a group consisting of aluminum, copper, silver, and gold.

9. The integrated silicon-based photo-detection system of claim 2, wherein the wirebonds comprise a metal selected from a group consisting of aluminum, copper, silver, and gold.

10. The integrated silicon-based photo-detection system of claim 2, further comprising:

a light blocking or absorbing adhesive potted around the isolated area of the SOI wafer and potted over the photodiode and the wirebonds, wherein the adhesive blocks light at visible wavelengths.

11. The integrated silicon-based photo-detection system of claim 10, wherein the light blocking or absorbing adhesive comprises an optically opaque epoxy.

12. The integrated silicon-based photo-detection system of claim 2, further comprising:

a light blocking or absorbing adhesive potted around the isolated area of the SOI wafer, wherein the adhesive blocks light at visible wavelengths, wherein an end of the electrical traces connected to the photodiode is on the isolated area of the SOI wafer; and wherein the wirebonds and the other end of the electrical traces connected to the wirebonds are outside of the isolated area of the SOI wafer.

13. The integrated silicon-based photo-detection system of claim 1, further comprising:

an anti-reflective coating at a bottom of the photodiode; and an index-matched adhesive at the bottom of the photodiode.

14. The integrated silicon-based photo-detection system of claim 1, further comprising:

a second photodiode disposed adjacent to the photodiode in the isolated area, wherein the light barrier surrounds both the photodiode and the second photodiode in the isolated area.

15. The integrated silicon-based photo-detection system of claim 1, wherein the light barrier has a ratio of depth to width of at least 4:1.

16. A method of fabricating an integrated silicon-based photo-detection system in an integrated silicon based structure on a silicon-on-insulator (SOI) wafer, comprising:

performing deep etching on the SOI wafer to create a light barrier at least partially surrounding an isolated area of the SOI wafer, wherein the light barrier, when etched, is at least partially filled with air and is configured to isolate at least three sides of the isolated area of the SOI wafer from remaining areas of the SOI wafer;

fabricating a photodiode on the isolated area of the SOI wafer;

fabricating an optical waveguide that guides an input signal light into the photodiode, wherein the optical waveguide spans across the light barrier from the remaining areas of the SOI wafer to the isolated area of the SOI wafer; and bonding electrical traces, fabricated on the isolated area of the SOI wafer, to wirebonds to connect the electrical traces to remaining portions of the integrated silicon based structure.

17. The method of claim 16, further comprising:

potting a light blocking or absorbing adhesive around the isolated area of the SOI wafer and over the photodiode and the wirebonds, wherein the adhesive blocks light at visible wavelengths.

18. The method of claim 16, further comprising:

potting a light blocking or absorbing adhesive around the isolated area of the SOI wafer, wherein the adhesive blocks light at visible wavelengths;

wherein an end of the electrical traces connected to the photodiode is on the isolated area of the SOI wafer; and wherein the wirebonds and the other end of the electrical traces connected to the wirebonds are outside of the isolated area of the SOI wafer.

19. The method of claim 16, further comprising:

attaching an anti-reflective coating and an index-matched adhesive at a bottom of the photodiode.

20. The method of claim 16, wherein the light barrier has a ratio of depth to width of at least 4:1.

* * * * *